United States Patent [19]
Liao et al.

[11] Patent Number: 6,114,225
[45] Date of Patent: Sep. 5, 2000

[54] LOCAL PENETRATING PROTON BEAM TRANSMUTATION DOPING METHOD FOR SILICON

[75] Inventors: Chungpin Liao; Meihua Chao, both of Taichung, Taiwan

[73] Assignee: Industrial Technology Research Institute, Hsin-Chu, Taiwan

[21] Appl. No.: 09/192,455

[22] Filed: Nov. 16, 1998

[51] Int. Cl.[7] ................................................. H01L 21/04
[52] U.S. Cl. .......................... 438/510; 438/512; 438/520
[58] Field of Search ..................................... 438/510, 511, 438/512, 520, 528, 513

[56] References Cited

U.S. PATENT DOCUMENTS

| | | | |
|---|---|---|---|
| 3,982,967 | 9/1976 | Ku et al. | 438/528 |
| 4,124,826 | 11/1978 | Dixon et al. | 331/94.5 |
| 4,806,497 | 2/1989 | Adam et al. | 437/6 |
| 4,910,156 | 3/1990 | Takasu et al. | 437/17 |
| 4,987,087 | 1/1991 | Voss | 437/6 |
| 5,760,462 | 6/1998 | Barron et al. | 257/629 |

OTHER PUBLICATIONS

G.P. Gaidar et al., "Feasibility of transmutation doping of silicon by protion irradiation", May 1986 American Institute of Physics, pp. 607 & 608.

*Primary Examiner*—Charles Bowers
*Assistant Examiner*—Yennhu B. Huynh
*Attorney, Agent, or Firm*—George O. Saile; Stephen B. Ackerman

[57] ABSTRACT

Efficient transmutation doping of silicon through the bombardment of silicon wafers by a beam of protons is described. A key feature of the invention is that the protons are required to have an energy of at least 4 MeV to overcome the Coulomb barrier, thereby achieving practical utility. When this is done, transmutationally formed phosphorus in concentrations as high as $10^{16}$ atoms per cc. are formed from proton beams having a fluence as low as $10^{19}$ protons per square cm. As a byproduct of the process sulfur is also formed in a practical concentration range of about $10^{13}$ atoms per cc. This is readily removed by annealing at temperatures of the order of 700° C. Because of the high energy of the protons, several silicon wafers may be processed simultaneously. As expected, the additional phosphorus is uniformly deposited throughout the entire thickness of a wafer. Masks, either freestanding or contact, may also be used in order to limit the transmuted regions to particular desired areas.

20 Claims, 4 Drawing Sheets

LOCAL PENETRATING PROTON BEAM TRANSMUTATION DOPING METHOD FOR SILICON

FIELD OF THE INVENTION

The invention relates to the general field of semiconductor doping with particular reference to the use of proton beams for this purpose.

BACKGROUND OF THE INVENTION

Traditionally, impurity doping in silicon wafers during the fabrication of microelectronic circuits has been performed by using one of two easily implemented, but relatively shallow, impurity injection methods, namely, diffusion and ion implantation. There are occasions, however, when deep, even wafer-penetrating, vertical doping is desired. For example, in the making of smart-power IC devices, in producing power MOSFETs (Metal-Oxide-Semiconductor Field Effect Transistor) or IGBT (Insulated Gate Bipolar Transistor) with low on-resistance while maintaining high breakdown voltage, and in MEMS (Micro-Electro-Mechanical System) applications.

One way of overcoming these problems has been neutron transmutation doping. (NTD). The NTD process is based on the fact that, although silicon has an atomic number of 14 and an atomic weight of 28, naturally occurring silicon is not entirely made up of the $Si^{28}$ isotope. It turns out that $Si^{29}$ is present at a concentration of about 4.7 atomic % and $Si^{30}$ is present at a concentration of about 3.1 atomic %. Additionally, it turns out that $Si^{30}$, when bombarded by thermal neutrons, is transmuted to phosphorus $p^{31}$ (atomic number 15). Since the desired level of phosphorus doping is well below the 3.1 at. % of the already present $Si^{30}$, it is apparent that a limited amount of neutron bombardment of naturally occurring silicon, will result in the introduction of phosphorus dopant into the silicon. Such phosphorus dopant will be uniformly distributed and will also be in substitutional position in the lattice where it can act as a donor.

While the NTD process has been successfully applied on a number of occasions (see for example Takasu et al. In U.S. Pat. No. 4,910,156), the process does have a number of limitations and shortcomings including (i) neutron beams are hard to focus into a concentrated beam, (ii) the neutron flux can make surrounding equipment radioactive, and (iii) neutron beams, in practice, have a flux around $10^{14}/cm^2$ whereas a focused proton beam can have a flux anywhere between about $10^{13}$ to $10^{17}/cm^2$. As will be discussed in detail below, proton induced nuclear transmutation doping achieves the same end goals as NTD (namely deep, even wafer-penetrating, vertical and uniform n-type doping) but without some of the aforementioned disadvantages. We will refer to this process by its more general name—ion transmutation doping (ITD).

Prior to the work that led up to the present invention, the possibility of proton induced ITD on silicon received little or no attention. In particular, detailed information regarding the mechanisms and nuclear reaction cross-sections, as well as side effects, was not available for practical use. We were unable to find prior art relating to deep and practical proton transmutation doping. Of interest were several references that teach the use of conventional doping methods in conjunction with proton bombardment for the purpose of creating lattice damage and hence a high density of recombination sites. Examples of these include Dixon et al. (U.S. Pat. No. 4,124,826), Adam et al. (U.S. Pat. No. 4,806,487) and Voss (U.S. Pat. No. 4,987,087). As will be explained below, a transitory side effect of proton induced ITD is the formation of some sulfur. The use of sulfur compounds in majority carrier devices is explored by Barron et al. (U.S. Pat. No. 5,760,462), suggesting that sulfur could actually be used to advantage although in our case any such byproduced sulfur would be likely, at a minimum, to damage any iron containing equipment with which it came in contact. A method for removing this sulfur byproduct is included as part of the present invention.

SUMMARY OF THE INVENTION

It has been an object of the present invention to increase the concentration of donor atoms in silicon under controlled conditions.

A further object of the invention has been to achieve said increase through the transmutation of silicon isotopes into phosphorus as a result of proton bombardment.

Another object of the invention has been that said process be cost-effective and fully compatible with existing techniques for the manufacture of silicon integrated circuits.

These objects have been achieved through the bombardment of silicon wafers by a beam of protons. A key feature of the invention is that the protons are required to have an energy of at least 4 MeV. When this is done, transmutationally formed phosphorus in concentrations as high as $10^{16}$ atoms per cc. are formed from proton beams having a fluence as low as $10^{19}$ protons per square cm., since a proton flux can be very high and thus require much less time than is needed for NTD. As a byproduct of the process sulfur is also formed in a concentration range of about $10^{13}$ atoms per cc. This is readily removed by annealing at temperatures in the order of 800–1,000° C. Because of the high energy of the protons, several silicon wafers may be processed simultaneously. It follows that the additional phosphorus is uniformly deposited throughout the entire thickness of a wafer. Masks, either freestanding or contact, may also be used in order to limit the transmuted regions to particular desired areas.

DESCRIPTION OF THE PREFERRED EMBODIMENTS

One possible reason why proton ITD has not found earlier application in the semiconductor art may be the fact that at low bombardment energies (less than about 400 keV, the upper limit for most ion implanters), the transmutation effect is essentially negligible.

However, if the proton bombardment energy is increased to exceed about 4 MeV, a new set of nuclear reactions occur. These are summarized in FIG. 6.

Equation 1 shows that $Si^{28}$ is transmuted to $P^{29}$ which decays to $Si^{29}$ with a half life of about four seconds. Some of the $p^{29}$ while it is temporarily present, is also transmuted under proton bombardment to $S^{30}$ which decays with a half life of about one second to $P^{30}$ which in turn decays with a half life of 2.5 minutes to $Si^{30}$ (which is not radioactive).

Figure 6:
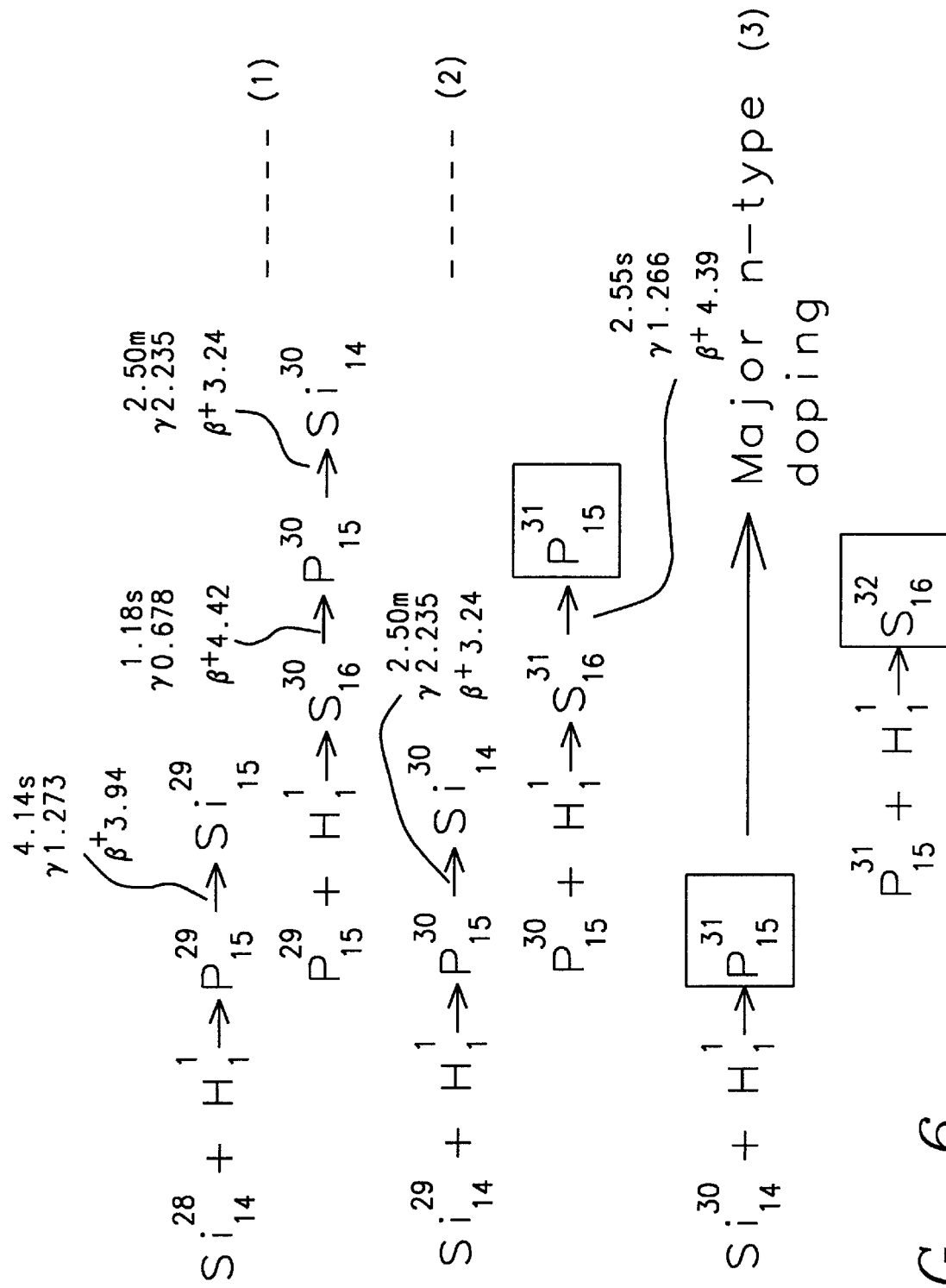
FIG. 6 shows the principal nuclear reactions that occur when high-energy protons bombard naturally occurring silicon.

Equation 2 in FIG. 6 shows that $Si^{29}$ is transmuted under proton bombardment to $P^{30}$ which decays, with a half life of 2.5 minutes, to $Si^{30}$. Under proton bombardment any $P^{30}$ that has not yet decayed is transmuted to $S^{31}$ which in turn decays to stable (non-radioactive) $P^{31}$. This provides a certain amount of P doping but is diluted by the possibility of decay of the $P^{30}$ before it can be struck by a proton.

The major source of N-type doping through proton bombardment is summarized in equation 3 in FIG. 6. In this reaction $Si^{30}$ is transmuted directly to $P^{31}$ which is not radioactive. However a certain amount of the $P^{31}$ will be transmuted through proton bombardment to $S^{32}$ which is not radioactive. Thus, depending on, amongst other things, the relative capture cross sections for protons of $Si^{30}$ and $P^{31}$, an equilibrium will be set up to establish the amount of $P^{31}$ that can be produced for a given fluence of protons.

Prior to performing our experiments, the practical minimum proton energy required to cause the proton-induced ITD was estimated by calculating the work needed to bring a proton and a silicon nucleus into contact. This was found to be 4 MeV which was subsequently confirmed by experiment.

Figure 1:
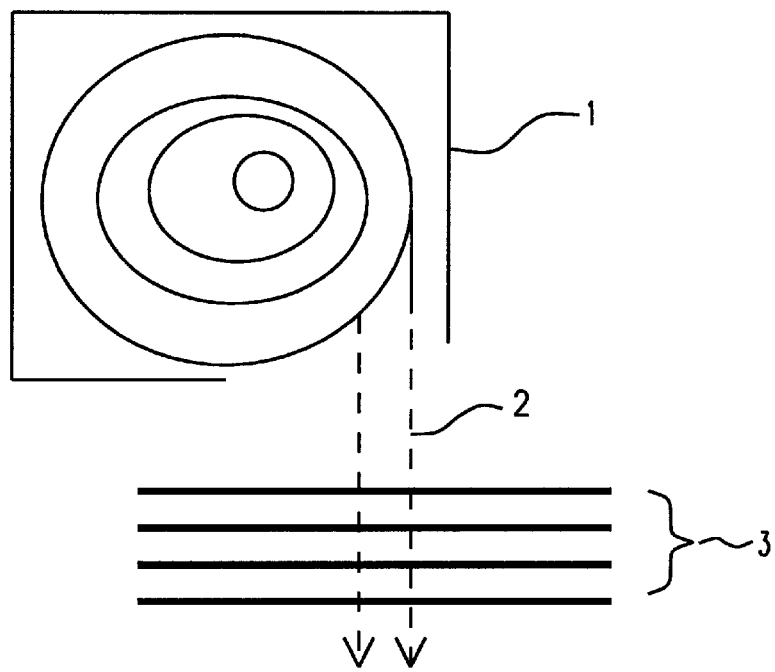
FIG. 1 is a schematic representation of a cyclotron showing an emerging beam of protons passing through a stack of wafers.

In order to produce a reliable beam of protons having energies above the minimum just cited, a conventional cyclotron was found to be efficient and economical. As illustrated in FIG. 1, cyclotron 1 emits proton beam 2. Said beam has an energy between about 5 and 30 MeV, with about 10–15 MeV being preferred. The typical current from the cyclotron was between about 10 $\mu A$ and 1 mA, corresponding to a flux between about $10^{14}$ and $10^{16}$ protons per square cm with a final fluence of about $10^{17}$–$10^{18}$ protons per square cm being typical.

At these energies, the penetration depth of the proton beam is between about 30 microns and 5 mm. This made it possible for several silicon wafers to be bombarded with protons at the same time. A stack of such wafers is shown schematically as 3 in FIG. 1. Since the typical width of the proton beam was about 2 cm., it was necessary to scan the beam across the surface of the wafers through movement of the latter.

Figure 2:
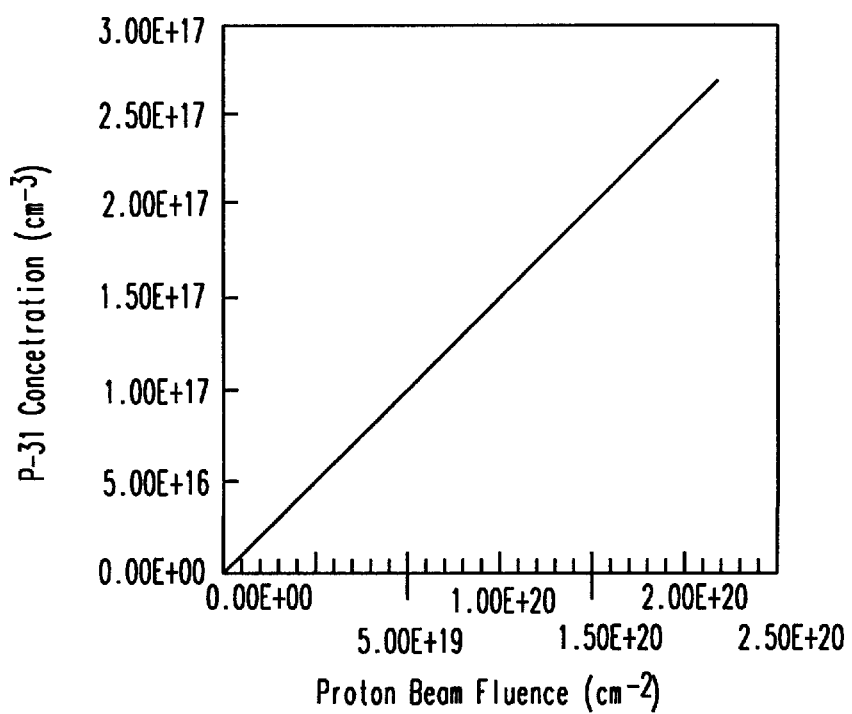
FIG. 2 is a plot of phosphorus concentration as a function of proton beam fluence.

After irradiation by protons at the above named energies and flux for a period of time between about 5 and 100 minutes, the resistivity and type of the silicon was checked to determine the increase in the number of donor atoms. A plot of the concentration of $P^{31}$ atoms as a function of proton beam fluence at an energy of 30 MeV is shown in FIG. 2. As can be seen, the P concentration is in linear relationship to the fluence.

It is important to note here that this relationship of transmuted silicon into phosphorus for a given level of proton fluence is about an order of magnitude higher than the equivalent result for neutron transmutation. This is a significant difference and is one of the major advantages of protons over neutrons for this kind of application. We also note here that, unlike neutron beams, high current proton beams are practical and, furthermore, are magnetically and/or electrically steerable.

Figure 3:
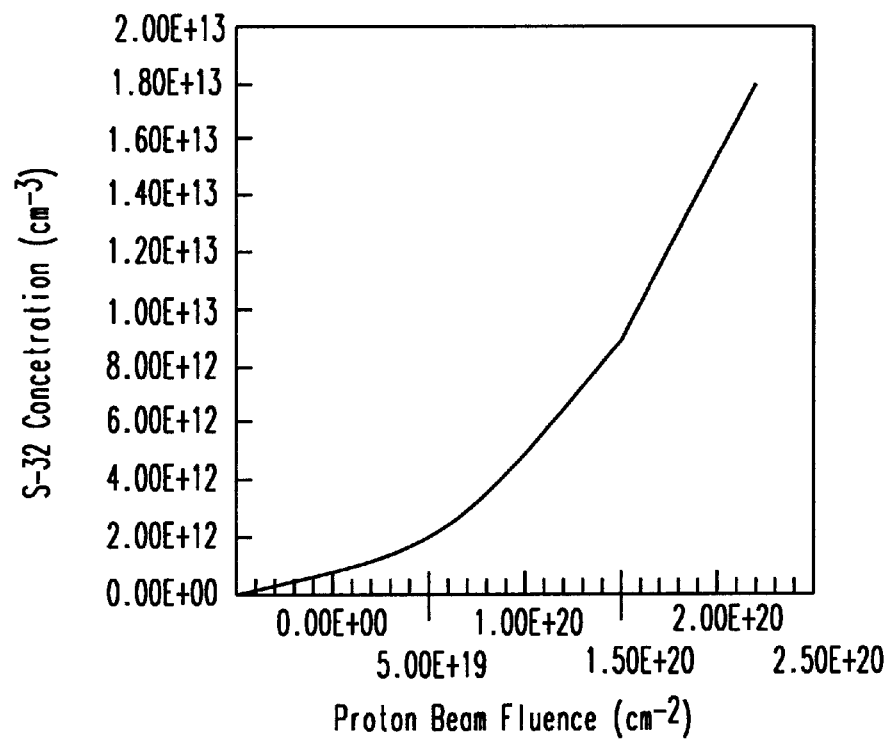
FIG. 3 is a plot of sulfur concentration as a function of proton beam fluence.

As discussed above, one byproduct of the proton bombardment of silicon is the formation of a certain amount of $S^{32}$. We estimated the concentration of transmutationally formed sulfur as a function of the proton beam fluence through numerical solution of the relevant nuclear reaction equations. The results are illustrated in FIG. 3 where it can be seen that even at the highest practical fluence, the S concentration did not exceed $1.8 \times 10^{13}$ atoms/cc.

Figure 4:
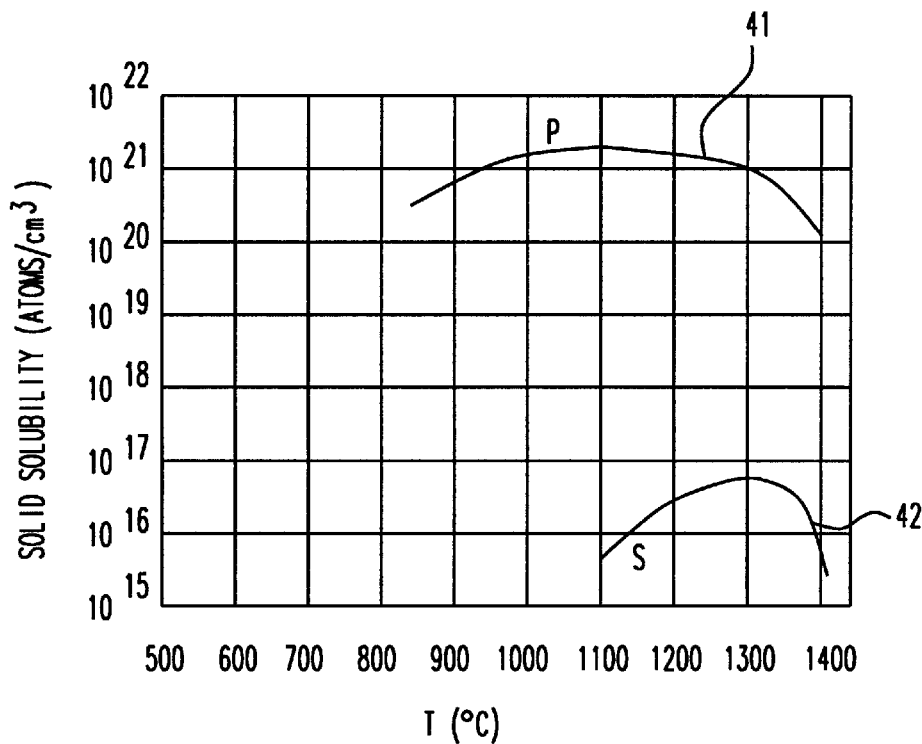
FIG. 4 is a plot of solid solubility as a function of temperature for phosphorus and sulfur in silicon.
Figure 5:
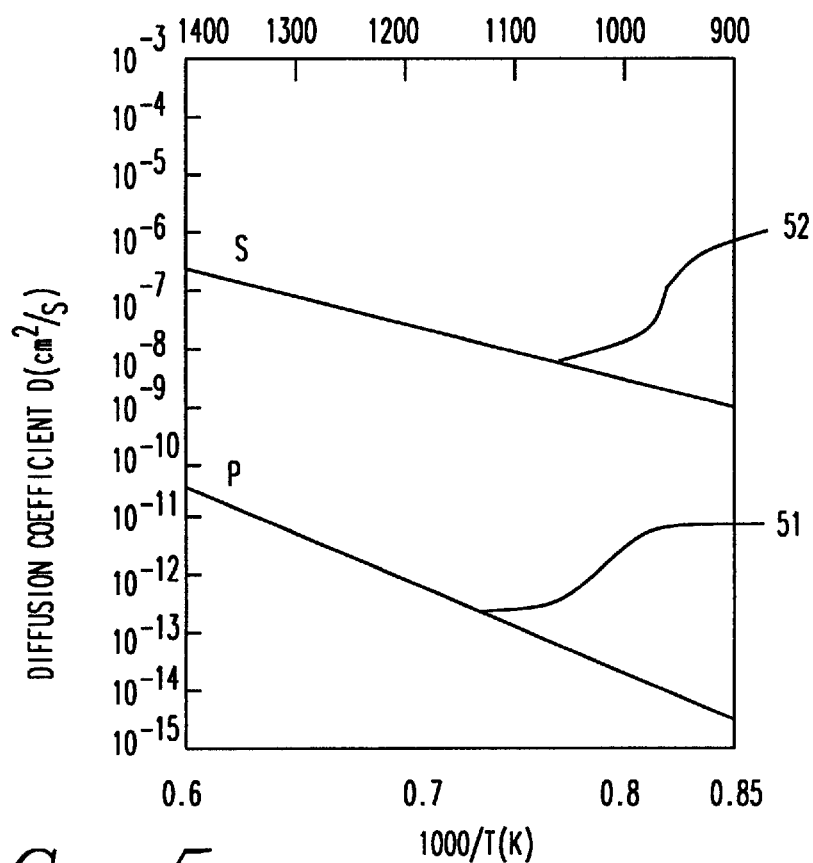
FIG. 5 is a plot of the diffusion coefficient as a function of temperature for phosphorus and sulfur in silicon.

Fortunately, the solubility of sulfur in silicon is low, particularly when compared to phosphorus. As may be seen in FIG. 4, the solubility of phosphorus (curve 41) has a maximum slightly in excess of $10^{21}$ atoms per cc. at about 1,000° C. whereas sulfur peaks at about $3 \times 10^{16}$ atoms per cc (curve 42) at about 1,300° C. Furthermore, sulfur has a high diffusion coefficient in silicon, again particularly when compared to phosphorus. This can be seen in FIG. 5. Thus, sulfur has a diffusion coefficient in silicon of about $10^{-8} cm^2/sec$ at 1,000° C. (Curve 52) while phosphorus has a diffusion coefficient of about $10^{-14} cm^2/sec$ at 1,000° C. (curve 51).

Because of these two differences in the properties of phosphorus and sulfur when dissolved in silicon, the removal of sulfur that was formed transmutationally as a byproduct of the proton bombardment was easy to accomplish. Prior to removing the sulfur, but after completion of the proton bombardment, it was necessary to clean the surfaces of the wafers. This was necessary to eliminate possible outgassing of surface contaminants. Cleaning was accomplished by means of the following steps:

first, the wafers were rinsed in deionized water for between about 2 and 5 minutes. This was followed by immersion in a mixture of ammonium hydroxide and hydrogen peroxide at a temperature between about 75 and 80° C. for between about 10 and 15 minutes. Next, they were etched in dilute hydrofluoric acid for between about 10 and 15 seconds and then given a second immersion in a mixture of ammonium hydroxide and hydrogen peroxide at a temperature between about 75 and 80° C. for between about 10 and 15 minutes. Finally, after rinsing in deionized water for between about 2 and 5 minutes; they were dried in nitrogen at a temperature between about 20 and 30° C. for between about 5 and 10 minutes.

Once the wafers had been cleaned, sulfur was removed by annealing in vacuum at a temperature between about 700 and 900° C. for between about 30 and 60 minutes. Though not essential, the efficiency of sulfur removal could be increased by including in the vacuum system a sulfur getter material such as iron or an iron alloy. The getter could be in the form of a mesh that surrounded the silicon wafers. With this done, the concentration of the remaining sulfur was estimated to be less than about $10^{12}$ atoms per cc. By contrast, the concentration of phosphorus atoms remained at its pre-anneal level of about $10^{16}$ atoms per cc.

When the process of the present invention was used as described above, it became possible to change conductivity type of the silicon in a variety of ways:

from P type to P−
from P type to N type
from N type to N+, and
from P type to N+.

In order to take full advantage of this ability to control the donor density through the entire thickness of a wafer, selective bombardment by protons was achieved by using masks. These were of two types. Freestanding proximity masks of materials such as aluminum, copper, gold, or nickel-iron alloy were made from foils that were between about 0.5 and 2 mm. thick, positioned between about 50 and 1,000 microns away from a wafer.

The second type of mask was a contact mask formed by first depositing a layer of a metal such as aluminum, copper, gold, or nickel-iron alloy. The thickness of the mask material was between about 2 and 10 microns allowing us to achieve a pattern resolution of between about 0.5 and 2 microns (for doping down to depths of between about 10 to 20 microns in the silicon).

We note here that the proximity masks make it possible to treat several wafers simultaneously by first aligning several masks and then inserting several wafers without losing said alignment.

While the invention has been particularly shown and described with reference to the preferred embodiments thereof, it will be understood by those skilled in the art that various changes in form and details may be made without departing from the spirit and scope of the invention.

What is claimed is:

1. A process for doping silicon having a first conductivity type, comprising:

directing a beam of protons, having an energy and a fluence, at the silicon, thereby tranforming the silicon to a second conductivity type;

cleaning the silicon; and under vacuum, annealing the silicon whereby transmutationally formed phosphorus is activated and transmutationally formed sulphur is removed.

2. The process of claim 1 wherein the energy of the protons is between about 5 and 30 MeV.

3. The process of claim 1 wherein the fluence of the proton beam is between about $10^{17}$ and $10^{19}$ protons/sq. cm.

4. The process of claim 1 wherein the step of annealing the silicon further comprises heating at a temperature between about 700 and 900° C. for between about 30 and 60 minutes.

5. The process of claim 1 wherein the concentration of transmutationally formed phosphorus is between about $10^{15}$ and $10^{16}$ per cc.

6. The process of claim 1 wherein the first conductivity type is P and the second conductivity type is P−.

7. The process of claim 1 wherein the first conductivity type is P and the second conductivity type is N.

8. The process of claim 1 wherein the first conductivity type is N and the second conductivity type is N+.

9. The process of claim 1 wherein the first conductivity type is P and the second conductivity type is N+.

10. The process of claim 1 wherein said silicon has a maximum thickness that is between about 30 microns and 5 mm.

11. The process of claim 1 wherein removing transmutationally formed sulphur further comprises placing, inside the vacuum, a sulphur getter selected from the group consisting of iron and iron alloys.

12. A process for phosphorus doping selected regions of a silicon integrated circuit that has a surface, comprising:

providing a source of energetic protons;

through a mask, directing a beam of said protons at the surface of the integrated circuit for a period of time;

cleaning the surface of the integrated circuit; and under vacuum, annealing said integrated circuit thereby removing transmutationally formed sulphur.

13. The process of claim 12 wherein the time for which the proton beam is directed at the integrated circuit is between about 5 and 100 minutes.

14. The process of claim 12 wherein the protons have an energy between about 5 and 30 MeV.

15. The process of claim 12 wherein said beam of protons has a fluence between about $10^{17}$ and $10^{19}$ protons/sq. cm.

16. The process of claim 12 wherein the step of cleaning the surface of the integrated circuit further comprises:

rinsing in deionized water for between about 2 and 5 minutes;

immersing in a mixture of ammonium hydroxide and hydrogen peroxide at a temperature between about 75 and 80° C. for between about 10 and 15 minutes;

etching in dilute hydrofluoric acid for between about 10 and 15 seconds;

immersing once more in a mixture of ammonium hydroxide and hydrogen peroxide at a temperature between about 75 and 80° C. for between about 10 and 15 minutes;

rinsing in deionized water for between about 2 and 5 minutes; and drying in nitrogen at a temperature between about 20 and 30° C. for between about 5 and 10 minutes.

17. The process of claim 12 wherein the step of annealing the integrated circuit further comprises heating at a temperature between about 700 and 900° C. for between about 30 and 60 minutes.

18. The process of claim 12 wherein the concentration of active donor ions in the selected regions is between about $10^{15}$ and $10^{16}$ per cc.

19. The process of claim 12 wherein the mask is a contact mask formed from a material selected from the group consisting of aluminum, copper, gold, and nickel-iron alloy.

20. The process of claim 12 wherein the mask is a free standing proximity mask formed from a material selected from the group consisting of aluminum, copper, gold, and nickel-iron alloy.

* * * * *